(12) United States Patent
Chuang et al.

(10) Patent No.: US 11,411,073 B2
(45) Date of Patent: Aug. 9, 2022

(54) SEMICONDUCTOR PACKAGE DEVICE AND METHOD FOR MANUFACTURING THE SAME

(71) Applicant: Advanced Semiconductor Engineering, Inc., Kaohsiung (TW)

(72) Inventors: Shao Hsuan Chuang, Kaohsiung (TW); Huang-Hsien Chang, Kaohsiung (TW); Min Lung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 107 days.

(21) Appl. No.: 16/802,465

(22) Filed: Feb. 26, 2020

(65) Prior Publication Data

US 2021/0265459 A1   Aug. 26, 2021

(51) Int. Cl.
| | |
|---|---|
| *H01L 23/64* | (2006.01) |
| *H01L 49/02* | (2006.01) |
| *H01L 21/48* | (2006.01) |
| *H01L 29/94* | (2006.01) |
| *H01L 27/108* | (2006.01) |
| *H01L 23/31* | (2006.01) |

(52) U.S. Cl.
CPC .............. *H01L 28/88* (2013.01); *H01L 28/60* (2013.01); *H01L 28/92* (2013.01); *H01L 21/4814* (2013.01); *H01L 23/3178* (2013.01); *H01L 27/10829* (2013.01); *H01L 27/10861* (2013.01); *H01L 29/945* (2013.01)

(58) Field of Classification Search
None
See application file for complete search history.

(56) References Cited

U.S. PATENT DOCUMENTS

| | | | |
|---|---|---|---|
| 2010/0052099 A1* | 3/2010 | Chang | H01L 28/91 257/535 |
| 2014/0008111 A1* | 1/2014 | Kuo | H01G 4/01 174/257 |
| 2015/0364538 A1* | 12/2015 | Wang | H01L 28/90 257/534 |
| 2020/0176614 A1* | 6/2020 | Ashimine | H01G 4/008 |
| 2020/0343336 A1* | 10/2020 | Chuang | H01L 28/91 |

* cited by examiner

*Primary Examiner* — Benjamin P Sandvik
(74) *Attorney, Agent, or Firm* — Foley & Lardner LLP

(57) ABSTRACT

A semiconductor package device includes a first conductive wall, a second conductive wall, a first insulation wall, a dielectric layer, a first electrode, and a second electrode. The first insulation wall is disposed between the first and second conductive walls. The dielectric layer has a first portion covering a bottom surface of the first conductive wall, a bottom surface of the second conductive wall and a bottom surface of the first insulation wall. The first electrode is electrically connected to the first conductive wall. The second electrode is electrically connected to the second conductive wall.

17 Claims, 15 Drawing Sheets

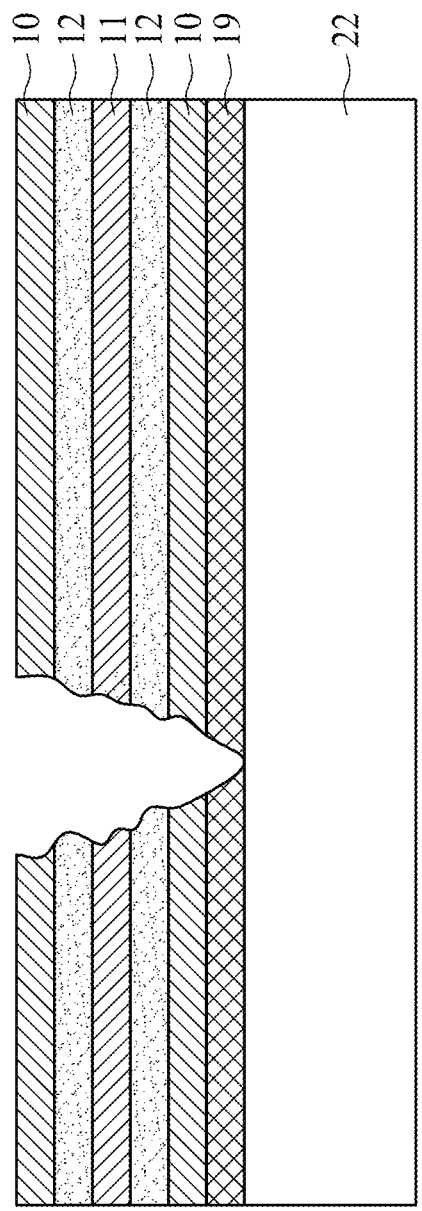

SEMICONDUCTOR PACKAGE DEVICE AND METHOD FOR MANUFACTURING THE SAME

BACKGROUND

1. Field of the Disclosure

The present disclosure relates to semiconductor package devices and methods thereof manufacturing the same.

2. Description of the Related Art

A deep trench capacitor is formed by filling metal and dielectric materials after etching trenches in a silicon wafer. The disadvantage is the capability of manufacturing deep trenches. Due to the process limit for etching trenches, the maximum capacitance of a deep trench capacitor is limited.

Stacked capacitors are manufactured by alternatively stacking metal and dielectric layers, each of the metal layers are electrically connected by redistribution layers (RDLs) or vias. The manufacture of a plurality of RDLs lowers the yield and the need for photomasks increase the manufacture cost.

SUMMARY

In some embodiments, the present disclosure provides a semiconductor package device. The semiconductor package includes a first conductive wall, a second conductive wall, a first insulation wall, a dielectric layer, a first electrode, and a second electrode. The first insulation wall is disposed between the first and second conductive walls. The dielectric layer has a first portion covering a bottom surface of the first conductive wall, a bottom surface of the second conductive wall and a bottom surface of the first insulation wall. The first electrode is electrically connected to the first conductive wall. The second electrode is electrically connected to the second conductive wall.

In some embodiments, the present disclosure provides a semiconductor package device. The semiconductor package device includes a first conductive wall, a second conductive wall, an insulation wall, a dielectric layer, a first conductive via, a second conductive via, a first electrode and a second electrode. The insulation wall is disposed between the first and second conductive walls. The dielectric layer covers a top surface of the first conductive wall, a top surface of the second conductive wall and a top surface of the insulation layer. The first conductive via penetrates the dielectric layer and in contact with the first conductive wall. The second conductive via penetrates the dielectric layer and in contact with the second conductive wall. The first electrode is electrically connected to the first conductive wall via the first conductive via. The second electrode is electrically connected to the second conductive wall via the second conductive via.

In some embodiments, the present disclosure provides a method for manufacturing a semiconductor package device. The method includes: providing a carrier; providing a multi-layered structure including a plurality of conductive walls wherein every two adjacent conductive walls are separated from each other by an insulation wall disposed between the every two adjacent conductive walls; bonding the multi-layered structure on the carrier; forming a first electrode electrically connected to one of the every two adjacent conductive walls; and forming a second electrode electrically connected to the other of the every two adjacent conductive walls.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 5C illustrates a cross-sectional view of a stacked structure according to some other embodiments of the present disclosure.

Figure 1:
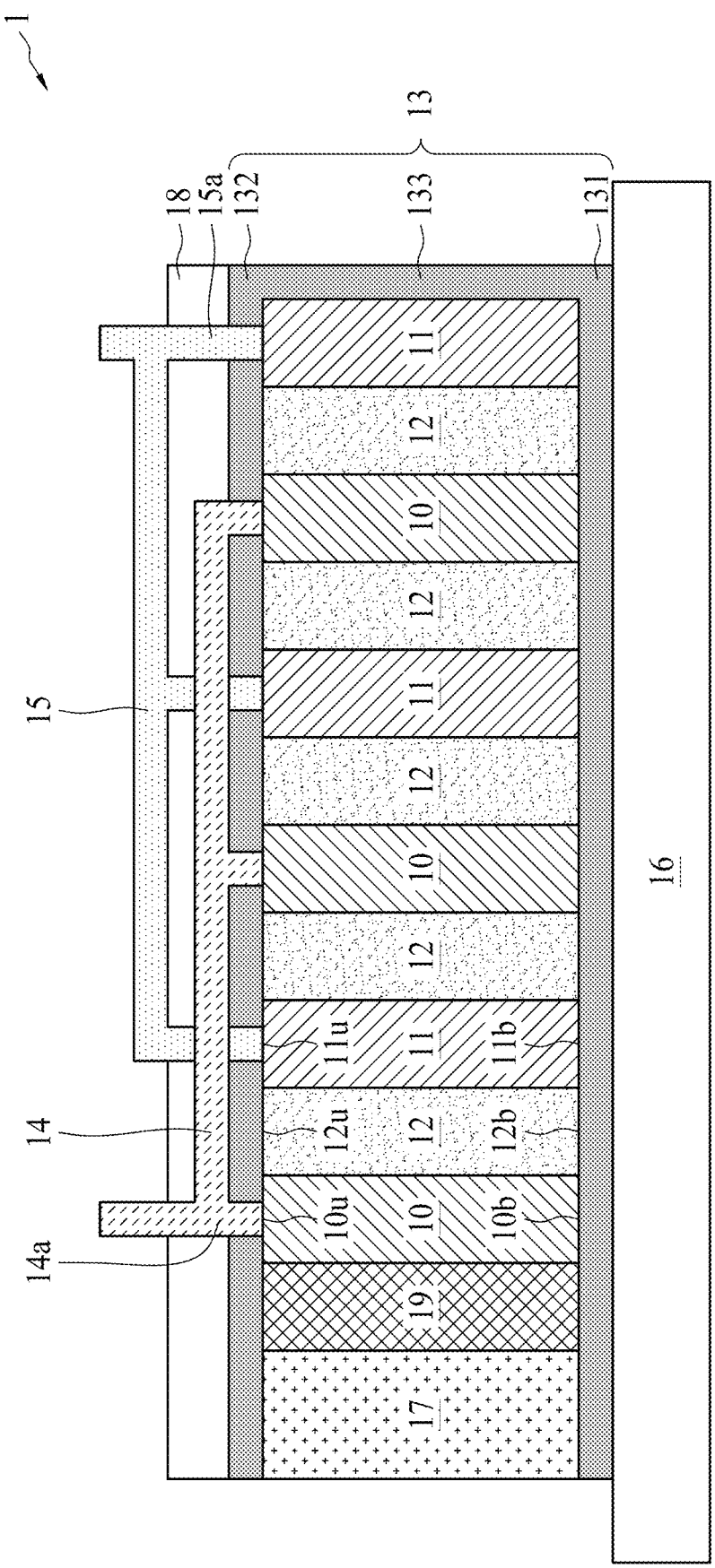
FIG. 1 illustrates a cross-sectional view of a semiconductor package device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

DETAILED DESCRIPTION

The following disclosure provides for many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 illustrates a cross-sectional view of a semiconductor package device 1 according to some embodiments of the present disclosure. In some embodiments, the semiconductor package device 1 may be used as a capacitor. The semiconductor package device 1 includes conductive walls 10 and 11, insulation walls 12, a dielectric layer 13, a conductive layer 14 and a conductive layer 15. The term "wall" used in the present disclosure may refer to a vertical plate or a vertical layer.

As shown in FIG. 1, the conductive walls 10 and 11 are disposed alternatively and separated from each other by the insulation walls 12. The conductive walls 10 are electrically isolated from the conductive walls 11. The conductive wall 11 is disposed between the insulation walls 12. The insulation wall 12 is disposed between the conductive wall 10 and 11. The conductive wall 10, the conductive wall 11 and the insulation wall 12 together form a sandwiched structure. The conductive walls 10 and 11 may be made of a same material or different material and may include, for example but is not limited to, copper (Cu), aluminum (Al), silver (Ag), graphite, metal, alloy, non-metal conductive material, or other suitable conductive material(s). The insulation wall 12 may include, for example but is not limited to, oxides (e.g., silicon oxide or titanium oxide), nitrides (e.g., silicon nitride), polyimides, carbon nanofibers (CNF) or other suitable material(s).

In some embodiments, an insulation wall 19 is disposed adjacent to an outmost one of the conductive walls 10 and 11 (e.g., an conductive wall 10 illustrated in FIG. 1). The insulation wall 19 may be may include, for example but is not limited to, oxides (e.g., silicon oxide or titanium oxide), nitrides (e.g., silicon nitride), polyimides, carbon nanofibers or other suitable material(s). The insulation wall 19 and the insulation wall 12 may be made of a same material as or different material.

In some embodiments, a semiconductor wall 17 may be further disposed adjacent to the insulation wall 19. The semiconductor wall 17 may include semi-conductive material(s). The semiconductor wall 17 may include, for example but is not limited to, silicon, SiC, $Al_2O_3$ or other suitable material(s). The semiconductor wall 17 may include dopant. The semiconductor wall 17 may include n-type dopant or p-type dopant. The semiconductor wall 17 may include, for example but is not limited to, phosphorus (P) or other suitable material(s). The semiconductor wall 17 may include, for example but is not limited to, boron (B) or other suitable material(s). In some embodiments, the semiconductor wall can be omitted. The semiconductor wall 17 is used to support the structure and may be omitted when more conductive and insulation walls are involved.

The dielectric layer 13 has three portions 131, 132 and 133. The dielectric layer 13 may include, for example but is not limited to, oxides (e.g., silicon oxide or titanium oxide), nitrides (e.g., silicon nitride), polyimides, carbon nanofibers or other suitable material(s). In some embodiments, the dielectric layer 13 includes silicon oxide, silicon nitride, titanium oxide or other dielectric materials.

The portion 131 of the dielectric layer 13 covers a bottom surface 10b of the conductive wall 10, a bottom surface 11b of the conductive wall 11 and a bottom surface 12b of the insulation wall 12. The portion 131 of the dielectric layer 13 is in contact with the bottom surface 10b of the conductive wall 10, the bottom surface 11b of the conductive wall 11 and the bottom surface 12b of the insulation wall 12. In some embodiments, the bottom surface 10b of the conductive wall 10, the bottom surface 11b of the conductive wall 11 and the bottom surface 12b of the insulation wall 12 are substantially coplanar.

The portion 132 of the dielectric layer 13 covers a top surface 10u of the conductive wall 10, a top surface 11u of the conductive wall 11 and a top surface 12u of the insulation wall 12. The portion 132 of the dielectric layer 13 is in contact with the top surface 10u of the conductive wall 10, the top surface 11u of the conductive wall 11 and the top surface 12u of the insulation wall 12. In some embodiments, the top surface 10u of the conductive wall 10, the top surface 11u of the conductive wall 11 and the top surface 12u of the insulation wall 12 are substantially coplanar.

The portion 133 of the dielectric layer 133 is disposed adjacent to the conductive wall 11. In some embodiments, the portion 133 of the dielectric layer 133 is disposed adjacent to an outmost one of the conductive walls 10 and 11 (e.g., an conductive wall 11 illustrated in FIG. 1). In some embodiments, the portion 133 of the dielectric layer 133 covers, or in contact with, a lateral surface of the sandwiched structure containing the conductive walls 10 and 11 and the insulation walls 12. In some embodiments, the portion 133 of the dielectric layer 133, together with the insulation wall 19 or the semiconductor wall 17 covers, or in contact with, all of the lateral surfaces of the sandwiched structure containing the conductive walls 10 and 11 and the insulation walls 12.

In some embodiments, a passivation layer 18 may be further disposed on the portion 132 of the dielectric layer 13. In some embodiments, the passivation layer 18 may cover a lateral surface of the dielectric layer 13 and the passivation layer 18 may extend downwardly to contact the carrier 16. The passivation layer 18 may include, for example but is not limited to, polyimides, CNF, oxides (e.g., titanium oxide, aluminum oxide, hafnium oxide, tantalum oxide) $BaTiO_3$, or other suitable material(s).

In the embodiments illustrated in FIG. 1, the conductive walls 10 and 11 and the insulation wall 12 are encapsulated by the dielectric layer 13.

In some embodiments, the semiconductor package device 1 further includes a carrier 16. The carrier 16 may include non-conductive material or insulation material. The carrier 16 may include, for example but is not limited to, glass, ceramics or other suitable materials. The portion 131 of the dielectric layer 13 is disposed between the carrier 16 and the bottom surface 10b of the conductive wall 10, the bottom surface 11b of the conductive wall 11 and the bottom surface 12b of the insulation wall 12. The carrier 16 is not in contact with the conductive walls 10 and 11, the insulation wall 12, the semiconductor wall 17 or the insulation wall 19.

The conductive layers (electrodes) 14 and 15 are patterned conductive layers and may include conductive traces, conductive pad(s), conductive land(s) or other circuitry element(s). The conductive layers (electrodes) 14 and 15 are electrically isolated from each other. The electrode 14 is electrically connected to a first set of conductive walls (i.e., conductive walls 10) while the electrode 15 is electrically connected to a second set of conductive walls (i.e., conductive walls 11). The electrode 14 is electrically connected to the conductive walls 10 via conductive vias 14a. The conductive via 14a penetrates the portion 132 of the dielectric layer 13 and is in contact with the conductive wall 10. The electrode 15 is electrically connected to the conductive walls 11 via conductive vias 15a. The conductive via 15a penetrates the portion 132 of the dielectric layer 13 and is in contact with the conductive wall 11. The electrode 14, the electrode 15, the conductive vias 14a and the conductive vias 15a may be made of a same material or a different material, and may include, for example, but is not limited to, copper or other suitable material(s).

The electrode 14 and the electrode 15 are electrically connected to an anode and a cathode of an external power source, respectively.

In some embodiments, the electrodes 14 and 15 may be at a same elevation. For example, the electrode 14 and the electrode 15 may be disposed on, or in contact with, the portion 132 of the dielectric layer 13.

In some embodiments, the electrode 14 and the electrode 15 may be at different elevations. For example, the electrode 14 may be disposed on, or in contact with, the portion 132 of the dielectric layer 13, the electrode 15 may be disposed on, or in contact with, the passivation layer 18 and the conductive vias 15a penetrates the portion 132 of the dielectric layer 13 and the passivation layer 18. The passivation layer 18 covers or encapsulates the electrode 14.

The semiconductor package device 1 may contain three, four or more conductive and insulation walls. In some embodiments, the semiconductor package device 1 may contain 10 to 50 conductive and insulation walls, or up to 60 conductive and insulation walls, or even more conductive and insulation walls.

Figure 2:
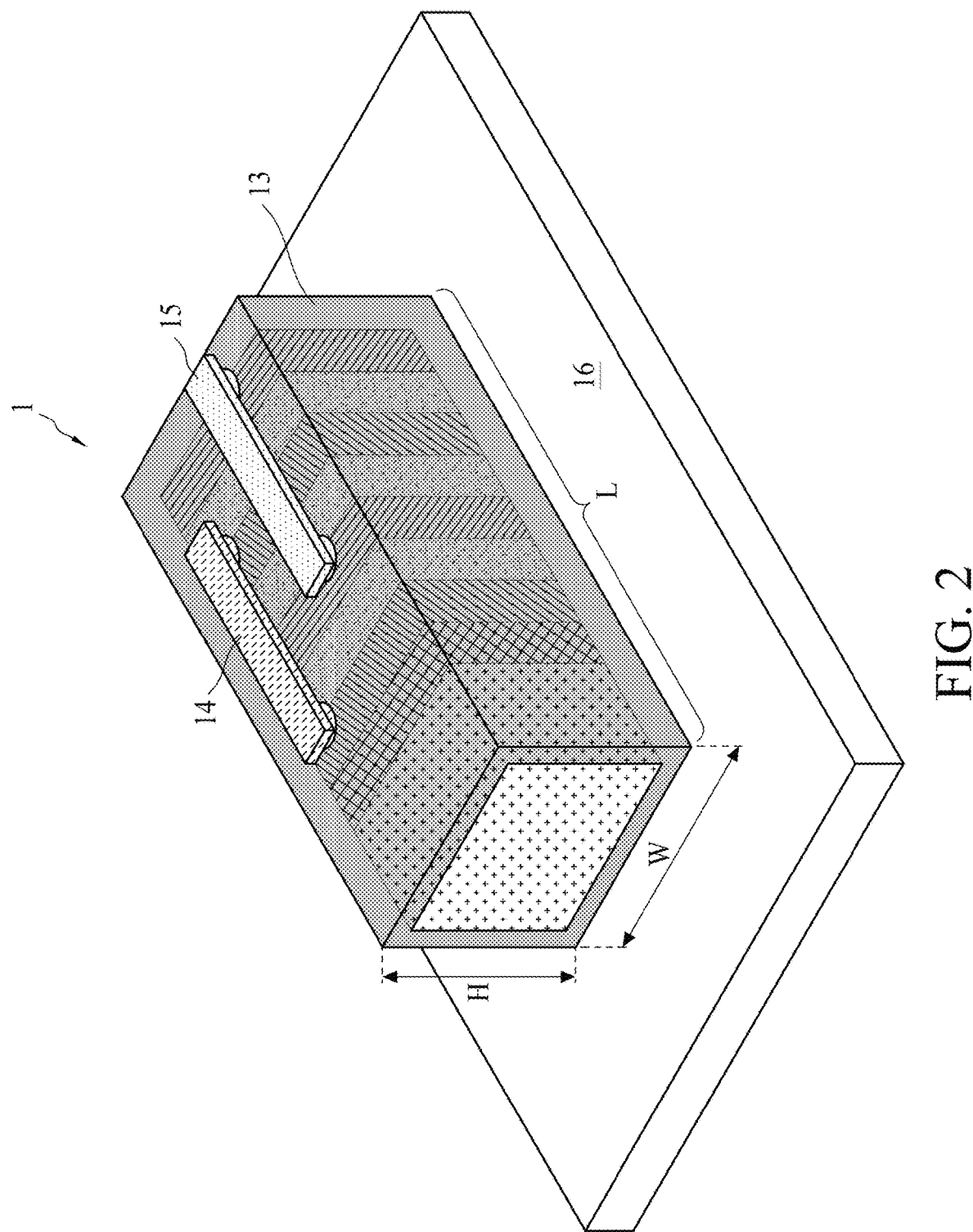
FIG. 2 illustrates a schematic view of the semiconductor package device e of FIG. 1.

FIG. 2 illustrates a schematic view of the semiconductor package device of FIG. 1 (the passivation layer 18 is not shown). In some embodiment, the semiconductor package device 1 may contain 50 conductive and insulation walls, a width W of the semiconductor package device 1 may be about 1 mm. a length L of the semiconductor package device 1 may be about 10 to 11 mm. a height H of the semiconductor package device 1 may be about 1 mm. It should be noted that the size (W, L or H) of the semiconductor package device may be designed depending on the need. The maximum capacitance of the semiconductor package structure 1, which contains 50 layers, may reach about 210 nF/mm$^2$. The semiconductor package structure 1 according to the present disclosure has a smaller volume with higher capacitance and is easier to be made as compared to the existing techniques, such as deep trench capacitors.

Figure 3:
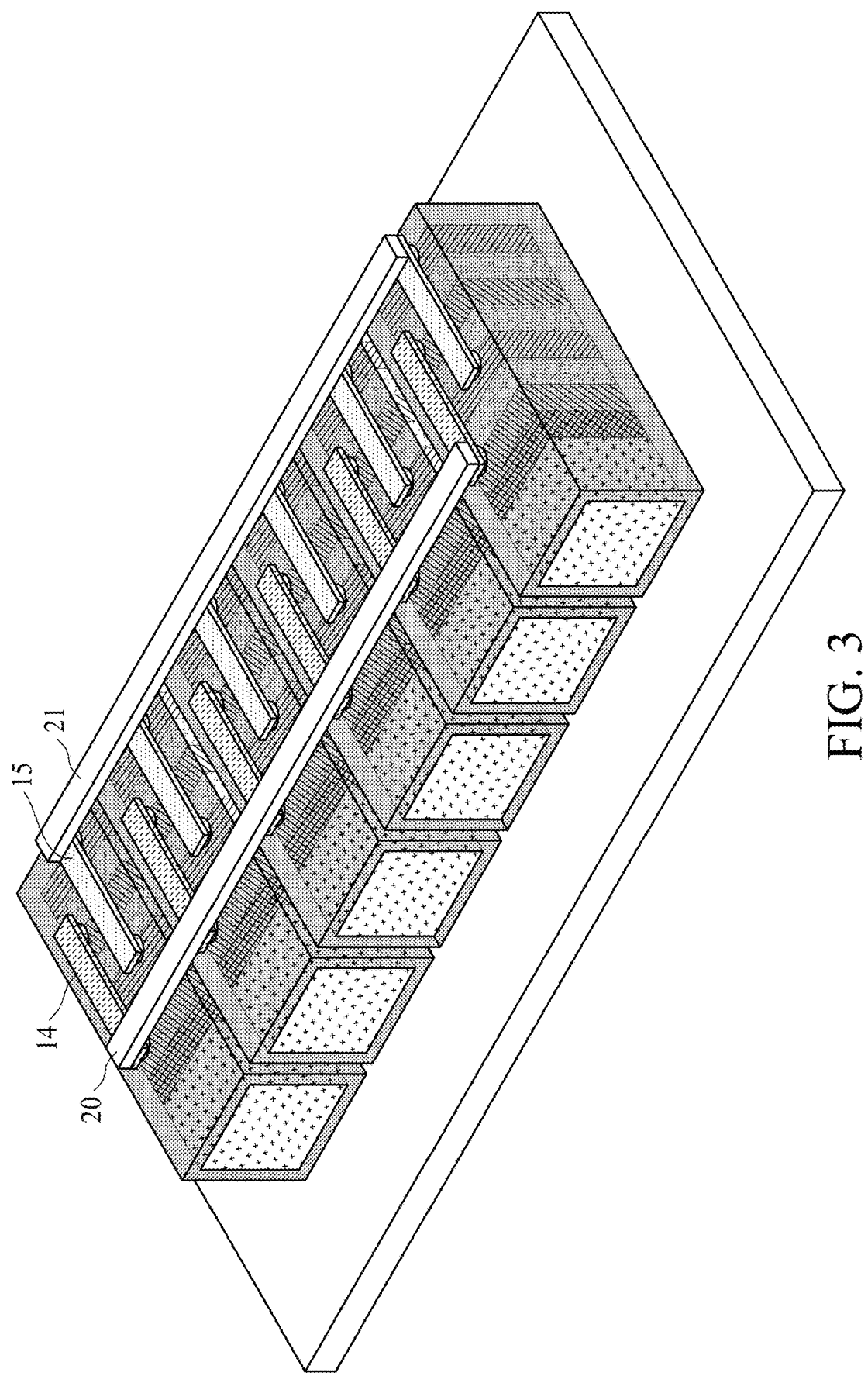
FIG. 3 illustrates an arrangement of a plurality of semiconductor package devices of FIG. 1.

In some applications, a plurality of the semiconductor package devices 1 in parallel or in series may be used. FIG. 3 illustrates an arrangement of a plurality of the semiconductor package devices 1 of FIG. 1. A plurality of the semiconductor package devices 1 are electrically connected by electrodes 20 and 21. The electrode 20 is electrically connected to the electrode 14 of each of the semiconductor package devices 1. The electrode 21 is electrically connected to the electrode 15 of each of the semiconductor package devices 1. The electrodes 20 and 21 are connected to an anode and a cathode of an external power source, respectively. The plurality of semiconductor package devices 1 shown in FIG. 3 is connected in parallel to arrive at a higher capacitance.

In some embodiments, the plurality of semiconductor package structures 1 are formed on a wafer of diameter 300 mm.

In some embodiments, the electrodes 14, 15, 20 and 21 are on the same side of the semiconductor package devices 1. The processes of manufacturing the semiconductor package device 1 are less complicated than those of manufacturing the semiconductor package device with electrodes formed on both sides.

Figure 4B:
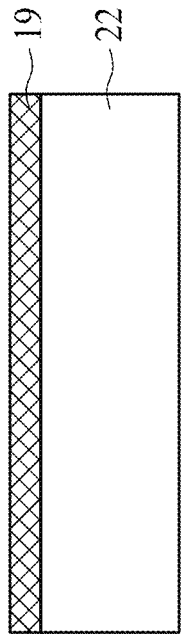
FIG. 4A through FIG. 4O illustrate various stages of a method of manufacturing a semiconductor package device according to some embodiments of the present disclosure.
Figure 4D:
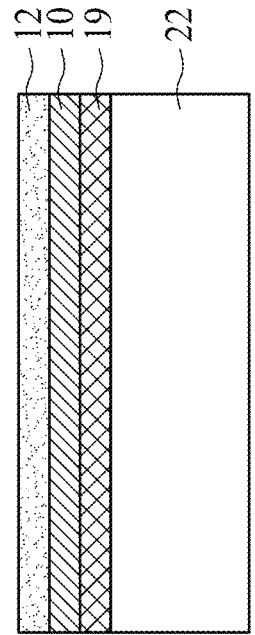
Figure 4A:
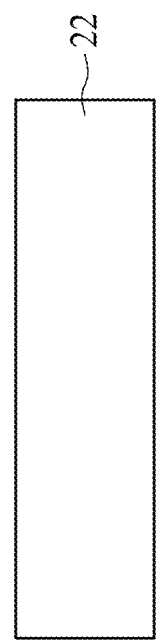
Figure 4C:
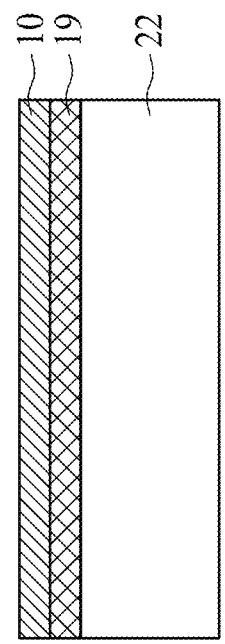
Figure 4F:
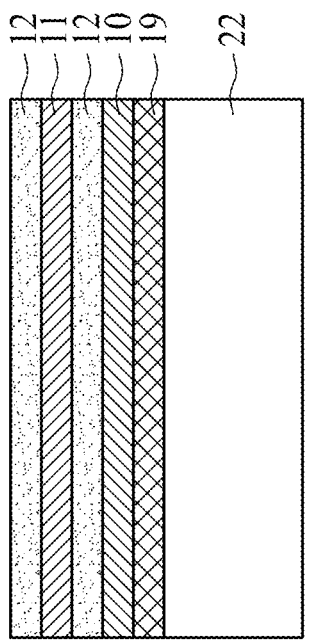
Figure 4H:
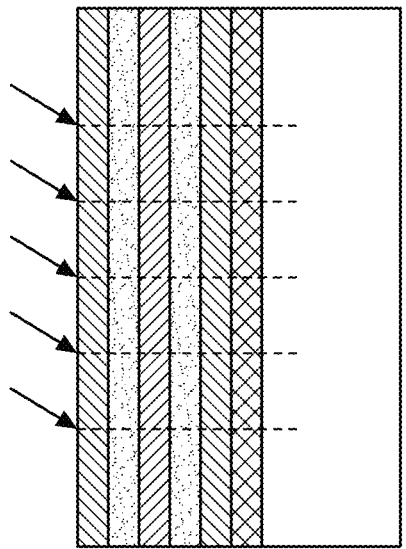
Figure 4E:
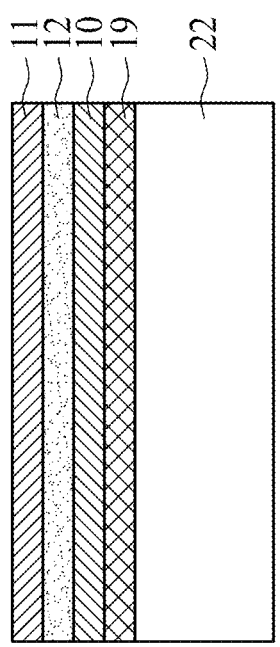
Figure 4G:
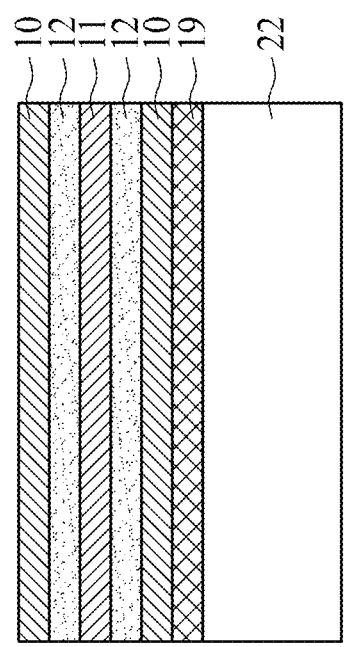
Figure 4I:
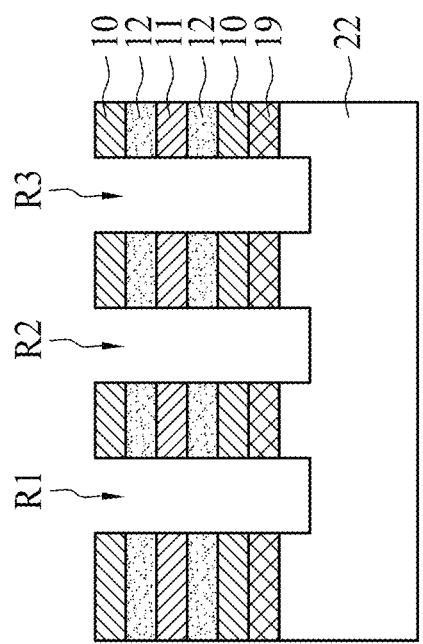
Figure 4J:
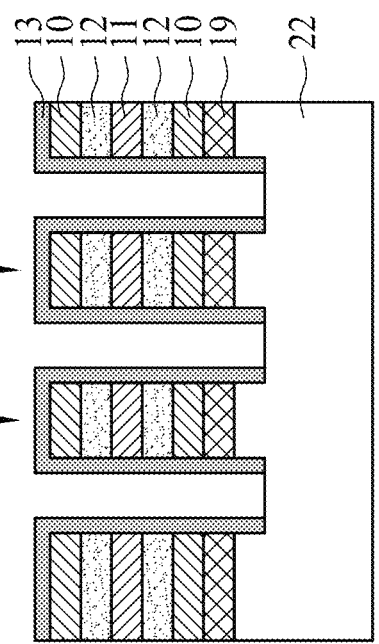
Figure 4K:
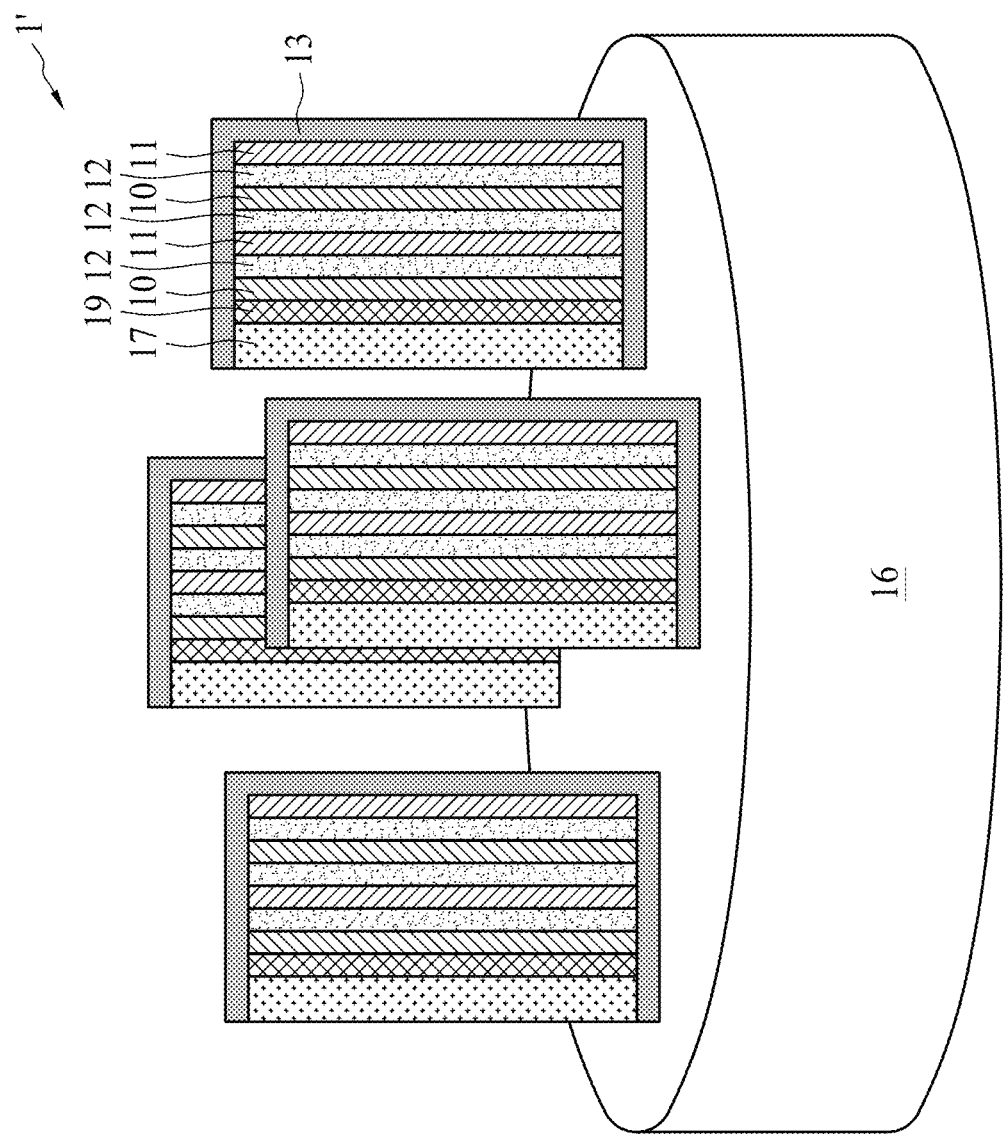
Figure 4L:
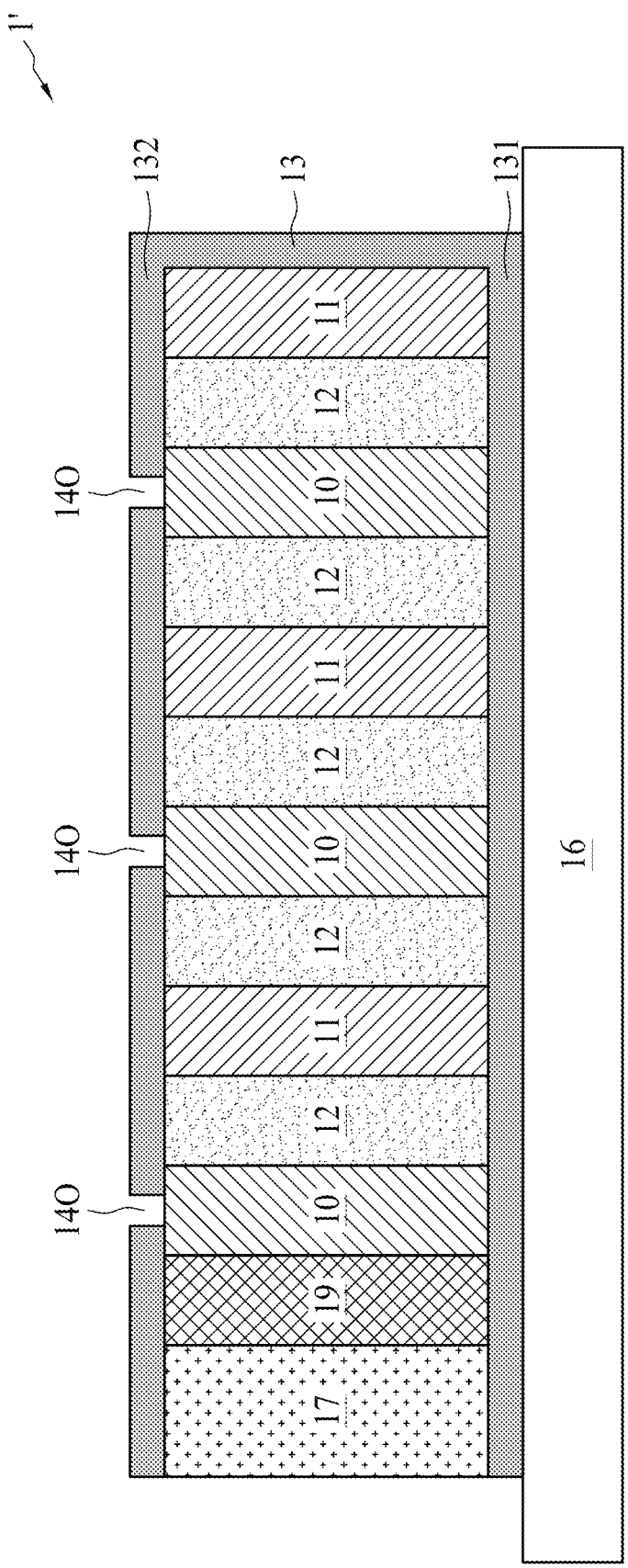
Figure 4M:
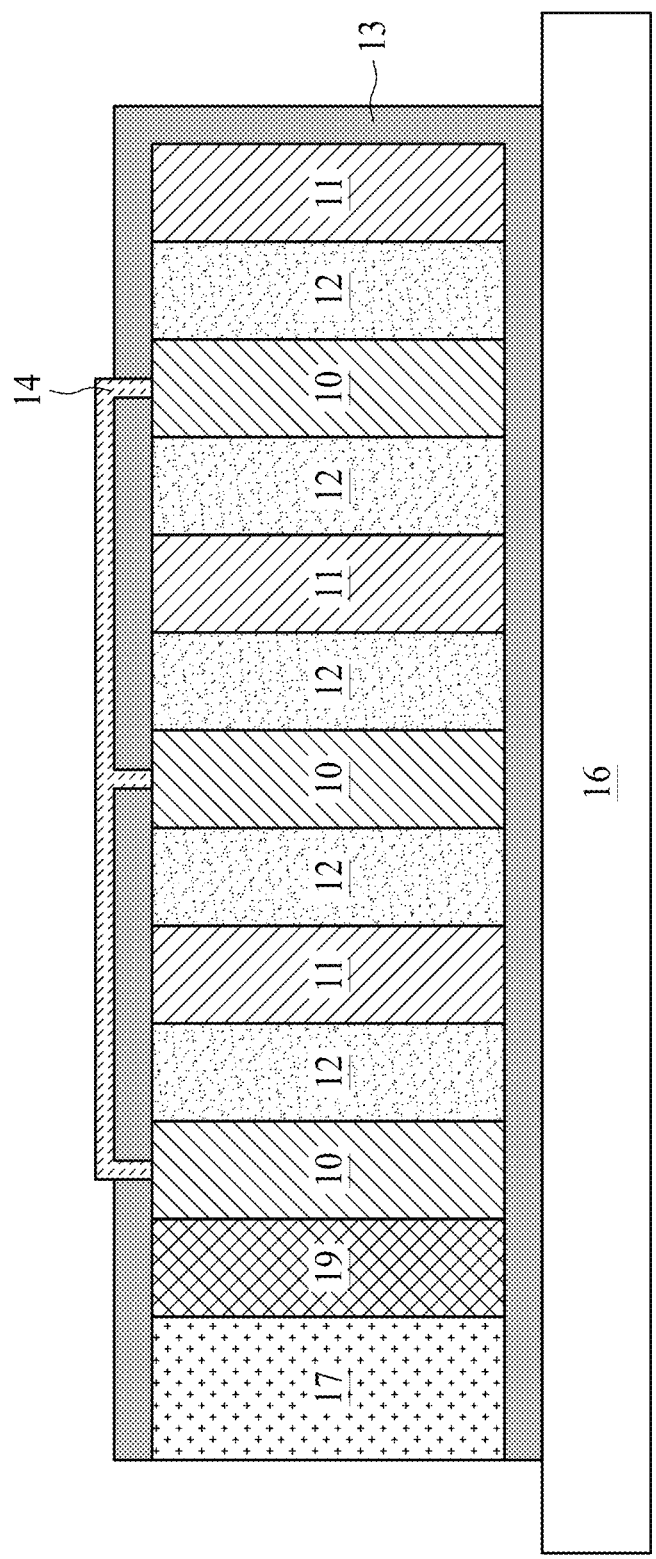
Figure 4N:
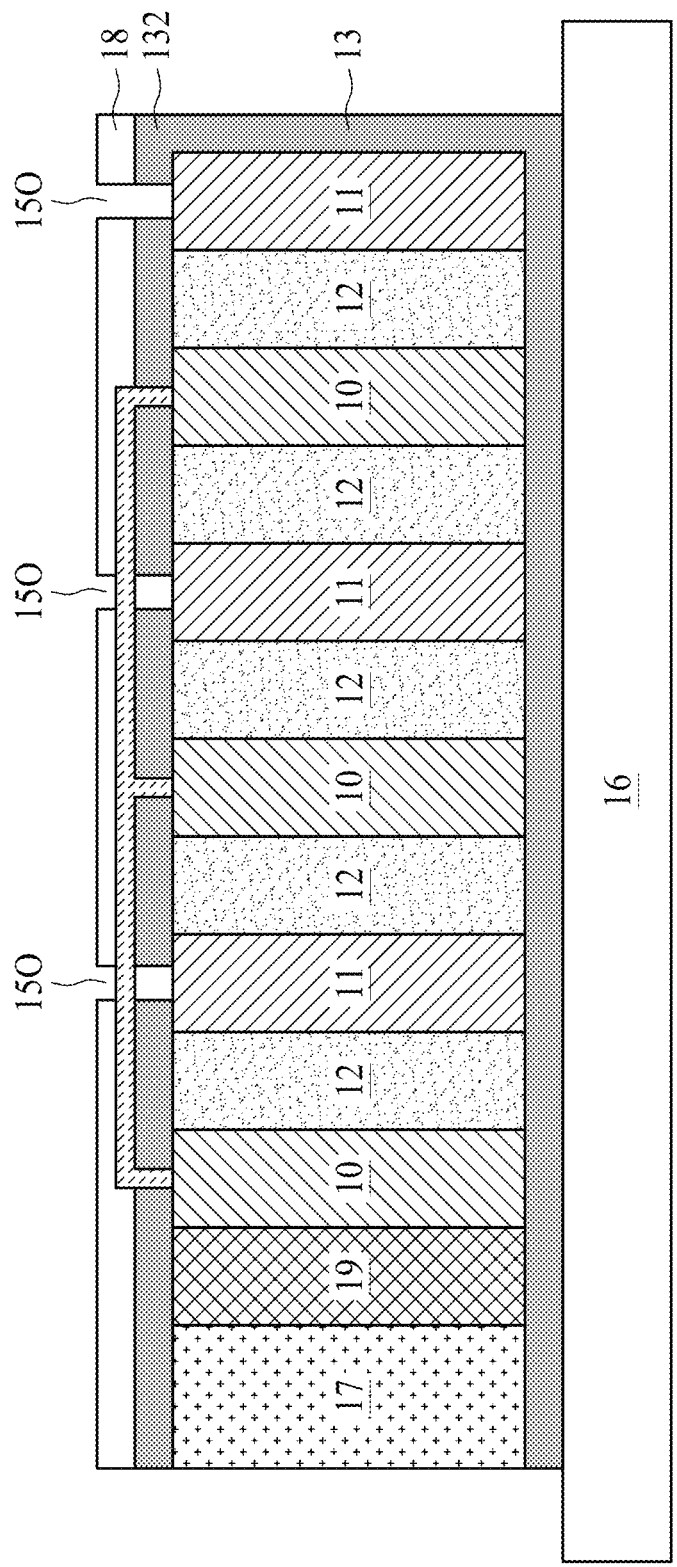
Figure 4O:
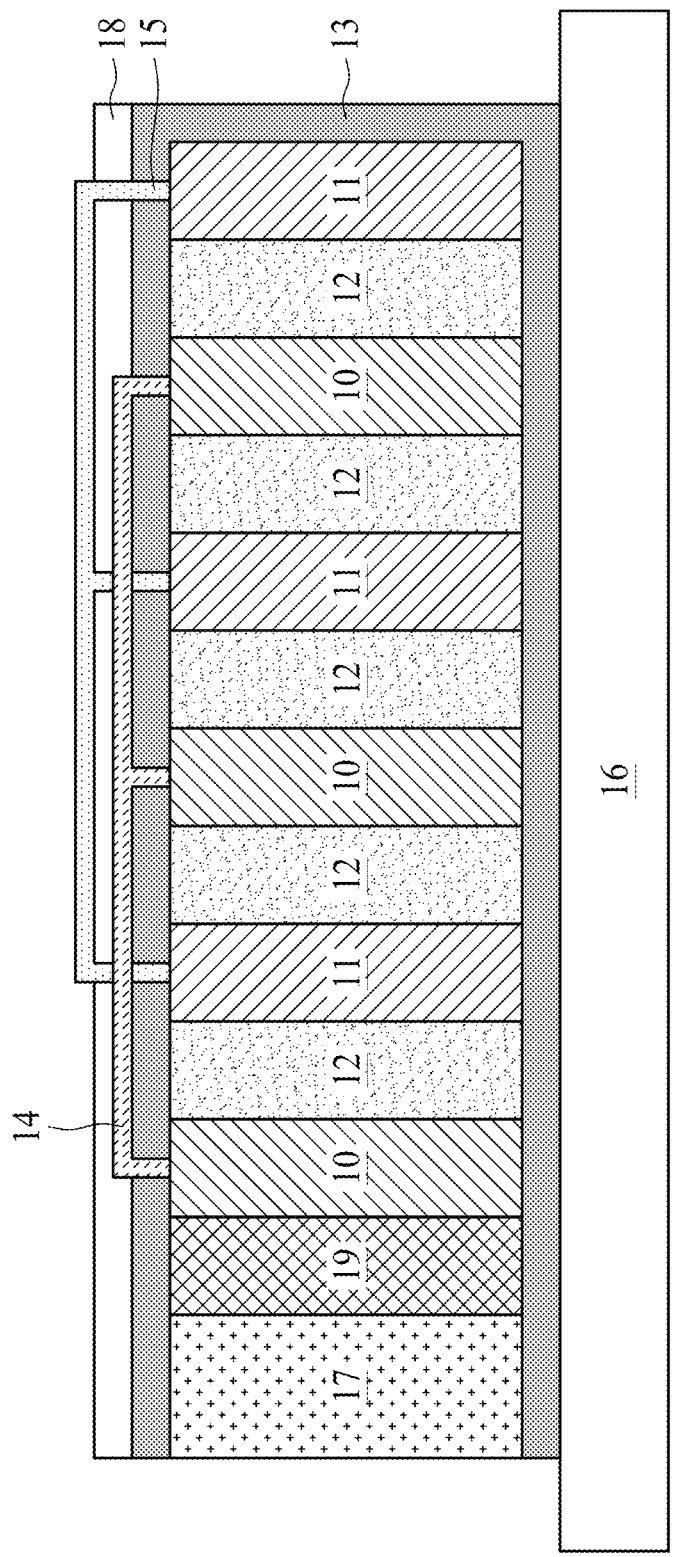

FIGS. 4A through 4O illustrate various stages of a method of manufacturing the semiconductor package device according to some embodiments of the present disclosure.

Referring to FIG. 4A, a carrier 22 is provided. The carrier 22 may be glass or a semiconductor substrate. The semiconductor substrate may include, for example but is not limited to, silicon (Si) or other suitable semi-conductive materials.

Referring to FIG. 4B, an insulation layer 19 is formed on the carrier 22.

Referring to FIG. 4C, a conductive layer 10 is formed on the insulation layer 19 formed in the stage illustrated in FIG. 4B.

Referring to FIG. 4D, an insulation layer 12 is formed on the conductive layer 10 formed in the stage illustrated FIG. 4C.

Referring to FIG. 4E, a conductive layer 11 is formed on the insulation layer 12 formed in the stage illustrated in FIG. 4D.

Referring to FIG. 4F, an insulation layer 12 is formed on the conductive layer 11 formed in the stage illustrated in FIG. 4E.

Referring to FIG. 4G, a conductive layer 10 is formed on the insulation layer 12 formed in the stage illustrated in FIG. 4F. A stacked structure including layers 10, 11, 12 and 19 is formed.

The insulation layers and the conductive layers may be formed by chemical vapor deposition (CVD), physical vapor deposition (PVD), or other suitable technique(s). The processes of sequentially forming the insulation layer 12, the conductive layer 11, the insulation layer 12 and the conductive layer 10 can be repeated performed several times after FIG. 4G.

Referring to FIG. 4H, a sawing operation may be performed to the structure as shown in FIG. 4G. The sawing operation may be performed along scribe lines (as shown by dotted lines). The sawing operation may be performed on the stacked structure or may be performed from a top of the stacked structure to a portion of the underlying carrier 22.

Referring to FIG. 4I, after the sawing operation, the stacked structure is divided into several units which are separated from each by the recesses (e.g., R1, R2 and R3).

Referring to FIG. 4J, a dielectric layer 13 is provide to cover each of the units in FIG. 4I. The dielectric layer 13 may be disposed on a top surface of the units and a lateral surface of the recesses. The dielectric layer 13 may be formed by, for example, chemical vapor deposition (CVD), coating, sputtering or the like. Micro-cracks may be generated on the surface of the stacked structure during the sawing operation illustrated in FIGS. 4H and 4I. The dielectric layer 13 may mend the micro-cracks. The dielectric layer 13 can electrically isolate the conductive layers to prevent short circuits. After forming the dielectric layer 13, a plurality of multi-layered structures 1' are formed on the carrier 22.

Afterwards, the plurality of multi-layered structures 1' are separated from the carrier 22. The separation may include grinding or de-bonding. In some embodiments, for example, when a semiconductor substrate is used as a carrier, the carrier 22 can be ground so as to separate the multi-layered structures 1' from each other and from the carrier 22. A portion of the semiconductor substrate may be retained in the separated multi-layered structures 1' and constitutes a semiconductor wall 17 illustrated in FIG. 4K. In some embodiments, for example, when a glass substrate is used as a carrier, the separation may include de-bonding the plurality of structures 1' from the carrier 22.

Referring to FIG. 4K, after the separation, the plurality of semiconductor package devices 1' are erected, e.g., rotated by 90 degrees, and bonded to a carrier 16 via the dielectric layer 13. The erected multi-layered structure 1' includes a plurality of conductive walls 10 and 11, a plurality of insulation walls 12 and 19 and a semiconductor wall 17. Every two adjacent conductive walls 10 and 11 are separated from each other by an insulation wall 12 disposed therebetween. In some embodiments, the carrier 16 may include oxides, such as silicon dioxide. The dielectric layer may include oxides (e.g., silicon oxide or titanium oxide), nitrides (e.g., silicon nitride), polyimides, carbon nanofibers or other suitable material(s) as discussed above. The bonding may include hybrid bonding. The hybrid bonding includes applying heat to form hydrogen covalent bond between the carrier 16 and the dielectric layer 13. As compared to metal bonding, the hybrid bonding according to the present disclosure can be carried out at a relatively low temperature. Furthermore, the hybrid bonding can reduce the use of solder and glue.

Referring to FIG. 4L, via holes 14O are formed in the portion 132 of the dielectric layer 13. The via holes 14O penetrate the portion 132 of the dielectric layer 13 and expose respective portions of the conductive walls 10.

Referring to FIG. 4M, a conductive layer (electrode) 14 is formed on the dielectric layer 13 with conductive vias formed in the via hole 14O. The electrode 14 is electrically connected to each of the conductive walls 10 via a respective one of the conductive vias. The electrode 14 may be a redistribution layer.

Referring to FIG. 4N, a passivation layer 18 is formed on and covers the structure in FIG. 4M. The passivation layer 18 is formed on the portion 132 of the dielectric layer 13. Then via holes 15O are formed in the passivation layer 18 and the portion 132 of the dielectric layer 13. The via holes 15O penetrate the passivation layer 18 and the portion 132 of the dielectric layer 13 and expose respective portions of the conductive walls 11.

Referring to FIG. 4O, a conductive layer (electrode) 15 is formed on the passivation layer 18 with conductive vias formed in the via hole 15O. The electrode 15 is electrically connected to each of the conductive walls 11 via a respective one of the conductive vias. The electrode 15 may be a redistribution layer. The electrode 14 and the electrode 15 are electrically isolated from each other. Although not shown in FIGS. 4N and 4O, a conductive via penetrating the passivation layer 18 may be formed and connect to the electrode 14 so the electrode 14 can connect to an external power source. After the above processes, the semiconductor package device 1 in FIG. 1 is achieved.

In some comparative processes of manufacturing a semiconductor package device including a capacitor structure, two comb-like electrodes are formed with fingers crossing with each other and an insulation layer is disposed between the electrodes to prevent short circuits. Dielectric layers, such as SiN, may be used as sacrifice layers to define the location of a second electrode. The dielectric layers are removed after the formation of a first electrode and the insulation layer, and then metal are filled to form the second electrode. However, when higher capacitances are needed, a high aspect ratio may cause the process of removing the dielectric layers and filling metal become too difficult to implement. If there is residue of the dielectric layers, reliability problems may occur. However, during the processes of manufacturing the semiconductor package device according to the present disclosure, no sacrifice layers need to be removed and no metal material needs to be filled, and the electrodes can be made, for example, by using only two photomask processes. Accordingly, the processes of manufacturing the semiconductor package device according to the present invention are easier and cheaper than the compara-tive processes. The semiconductor package device according to the present disclosure is more stable and the possibility of cracking of the electrodes due to the removal of dielectric layers, etc., can be reduced.

Figure 5A:
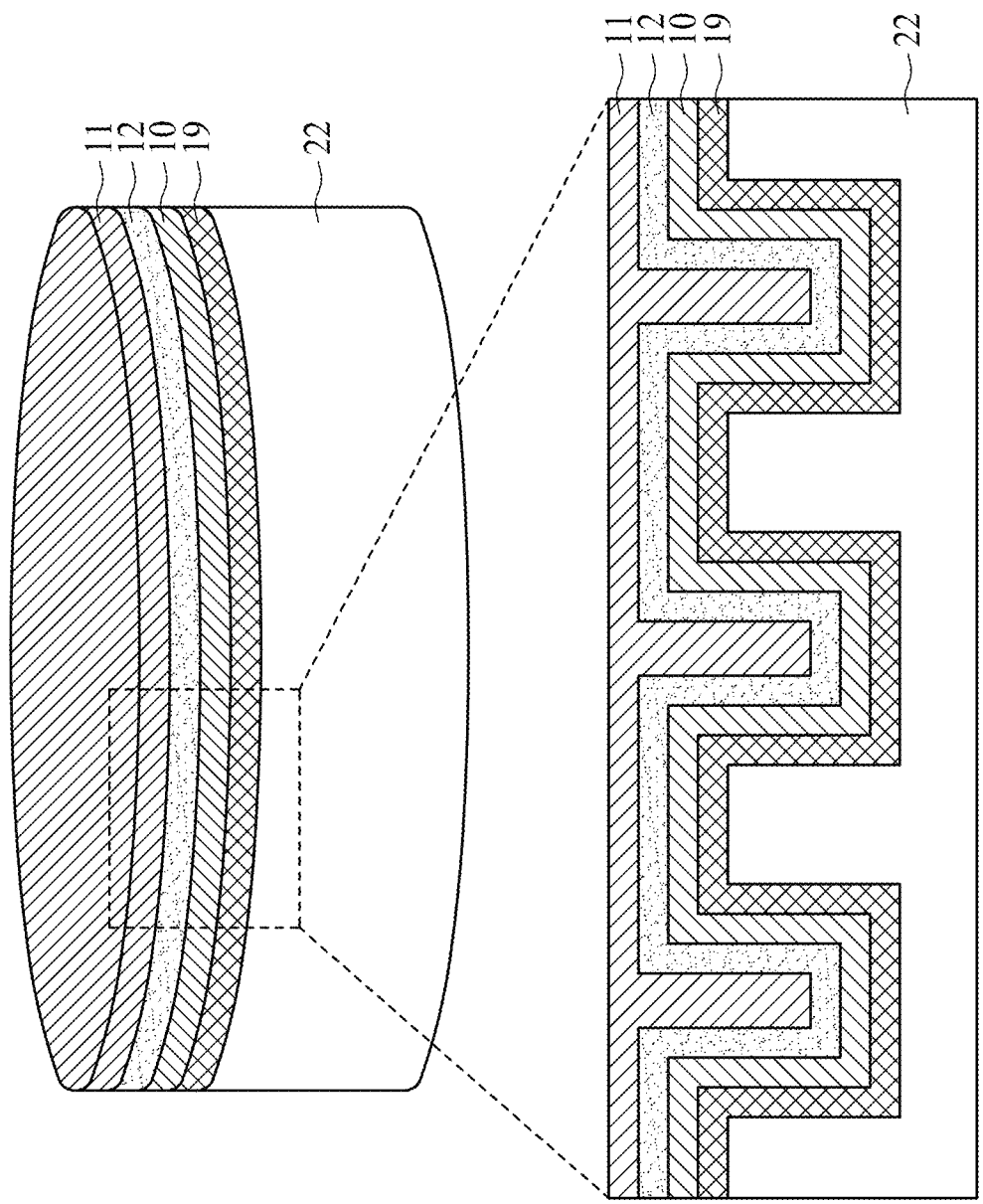
FIG. 5A illustrates a cross-sectional view of a stacked structure according to some embodiments of the present disclosure.

FIG. 5A illustrates an enlarged cross-sectional view of the stacked structure according to some embodiments of the present disclosure. The stacked structure can be formed in accordance with the operations illustrated in FIGS. 4A through 4G except that the carrier is patterned, before the formation of the conductive walls 10 and 11 and the insulation walls 12 and 19 of the stacked structure. As shown in FIG. 5A, the formed the stacked structure has a concave-convex structure. The patterning may be performed by, for example, plasma etching. The concave-convex structure can increase the contact surface area so as to enhance the bonding of the insulation walls 12 and 19, the conductive walls 10 and 11 and the carrier 22.

Figure 5B:
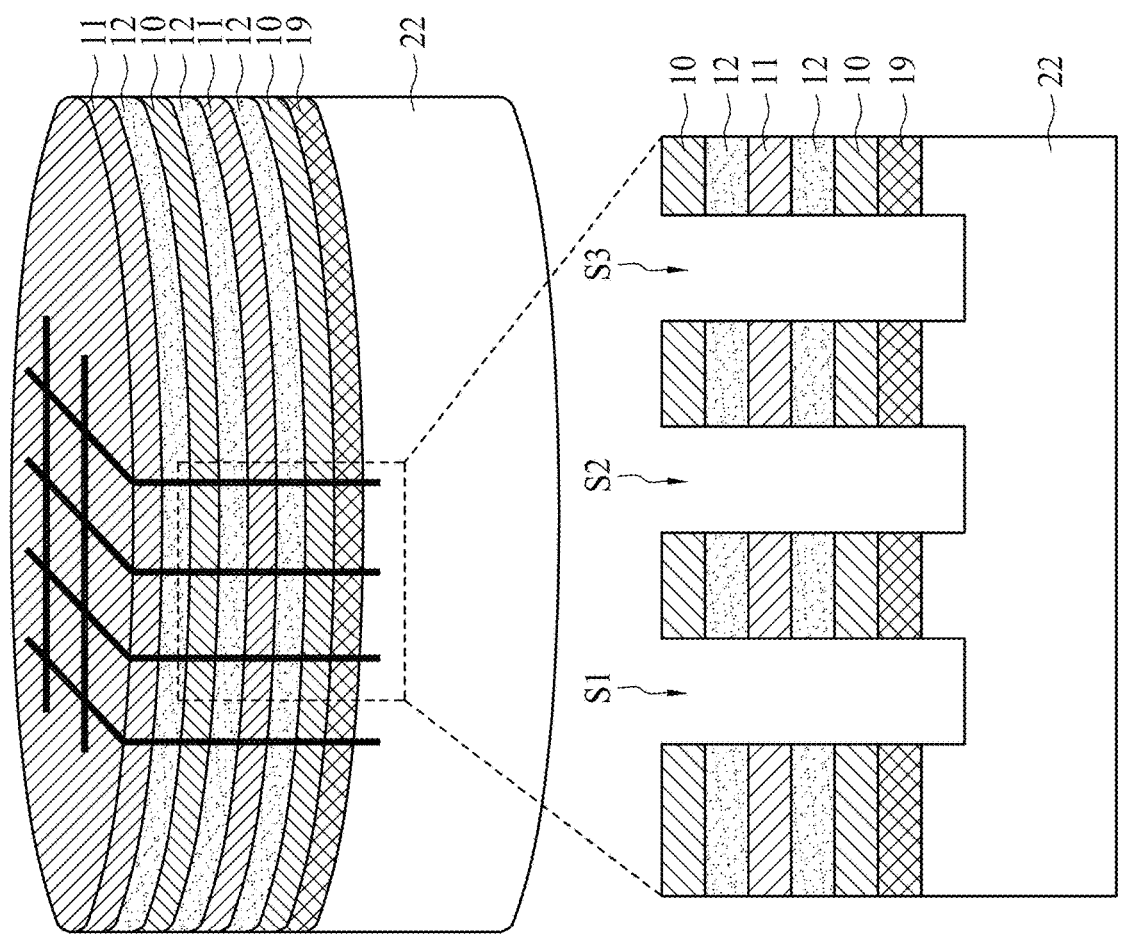
FIG. 5B illustrates a cross-sectional view of a stacked structure according to some embodiments of the present disclosure.

FIG. 5B illustrates an enlarged cross-sectional view of a stacked structure according to some embodiments of the present disclosure. The stacked structure illustrated in the lower portion of FIG. 5B is similar to that illustrated in FIG. 4I. The lower portion of FIG. 5B illustrates an enlarged cross-sectional view of the dotted rectangular on the upper portion of FIG. 5B. As shown in the upper portion of FIG. 5B, after the operation illustrated in FIG. 4I, the stacked structure is divided into several individual units while the bottom of the units is connected to the carrier 22. In some embodiments, the individual units can be formed through the operations illustrated in FIGS. 4A through 4I. In some embodiments, the individual units can be formed by depositing each of the insulation layers 12 and 19 and the conductive layers 10 and 11 on pre-determined regions of the carrier 22 using atomic layer deposition (ALD). The individual units may be separated from each other by spaces S1, S2 and S3 where no layer is deposited. With the use of ALD, the lateral surface of the stacked structure can be flat; in other words, the insulation walls 12 and 19 and the conductive walls 10 and 11 can be substantially coplanar along the lateral surface of the stacked structure.

FIG. 5C illustrates an enlarged cross-sectional view of a stacked structure according to some other embodiments of the present disclosure. The stacked structure illustrated in the lower portion of FIG. 5C is similar to that illustrated in FIG. 4I. The stacked structure can be divided into individual units, for example, by laser grooving. The laser grooving may be done using plasma. As a result, the stacked structure has a relatively-rough lateral surface after laser grooving and the recess formed by laser grooving is tapered from a top of the stacked structure to a distal end.

Figure 6A:
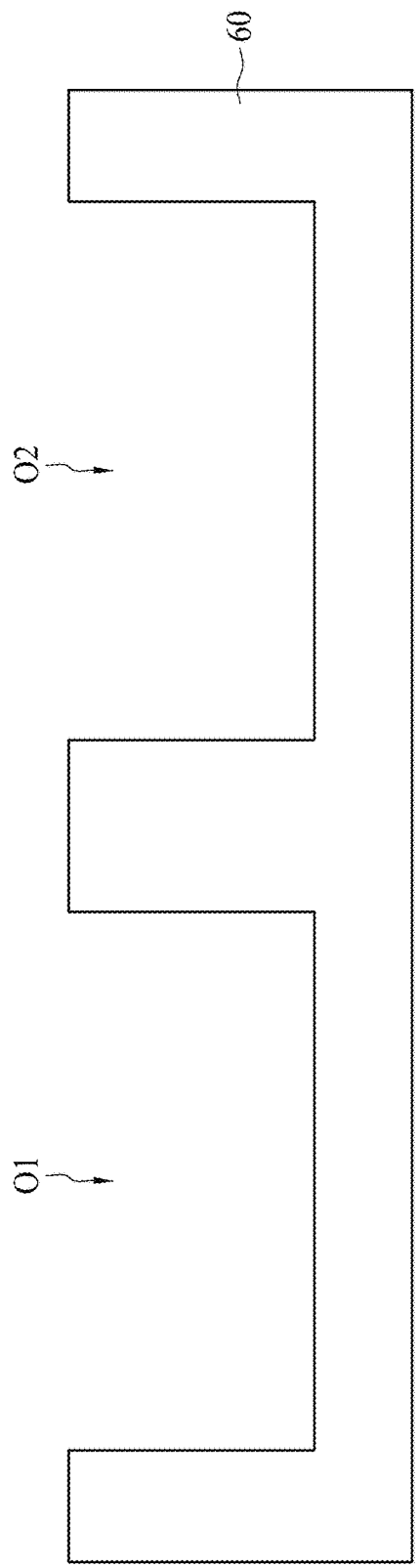
FIGS. 6A and 6B illustrate a method of forming an integrated semiconductor package structure according to some embodiments of the present disclosure.
Figure 6B:
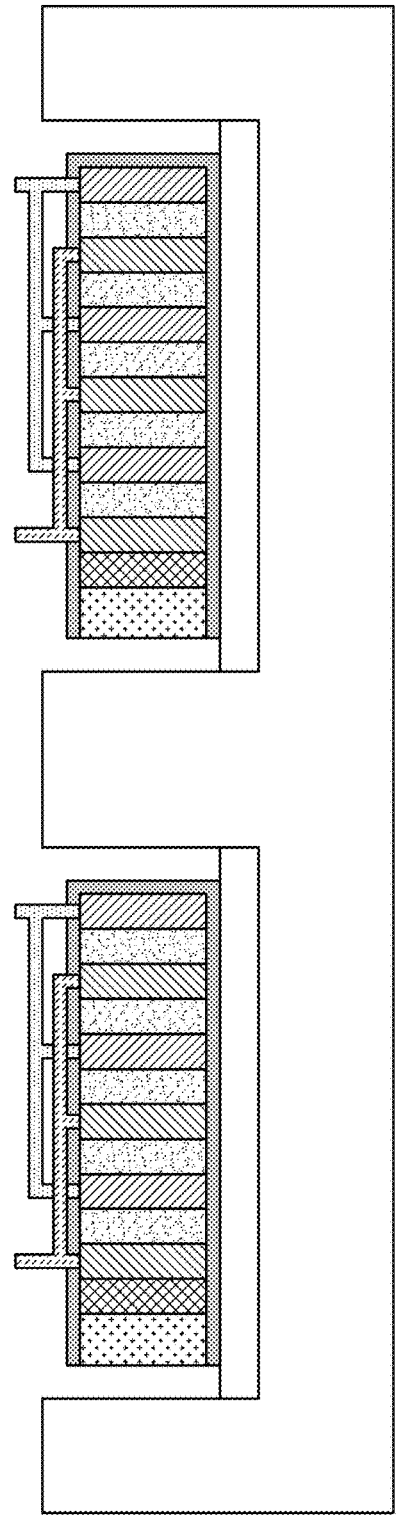

FIG. 6A and FIG. 6B illustrate various stages of a method of manufacturing a package structure according to some embodiments of the present disclosure.

Referring to FIG. 6A, a substrate 60 with openings O1 and O2 is provided. The substrate 60 may be a wafer, a redistribution layer or the like.

Referring to FIG. 6B, the semiconductor package devices 1 in FIG. 1 can be disposed in the openings O1 and O2, respectively, to form the package structure. The semiconductor package devices 1 in FIG. 1 can be embedded in the substrate 60. Since the semiconductor package devices 1 have an anode and a cathode exposed from a top surface of the carrier 60, there is no need to prepare electric circuitry within the substrate to connect to the semiconductor package devices 1. In addition, as discussed above, the size of the semiconductor package device 1 can be adjusted as need, which makes it more flexible to be used in various applications.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package device, comprising:
a first conductive wall;
a second conductive wall;
a first insulation wall disposed between the first and second conductive walls;
a dielectric layer having a first portion covering a bottom surface of the first conductive wall, a bottom surface of the second conductive wall and a bottom surface of the first insulation wall;
a first electrode electrically connected to the first conductive wall; and
a second electrode electrically connected to the second conductive wall,
wherein the bottom surface of the first conductive wall, the bottom surface of the second conductive wall and the bottom surface of the first insulation wall are relatively-rough than a lateral surface of the first conductive wall or a lateral surface of the second conductive wall.

2. The semiconductor package device of claim 1, wherein the dielectric layer has a second portion covering a top surface of the first conductive wall, a top surface of the second conductive wall and a top surface of the first insulation wall.

3. The semiconductor package device of claim 1, wherein the first and second conductive walls and the first insulation wall are encapsulated by the dielectric layer.

4. The semiconductor package device of claim 1, further comprising a carrier, wherein the first portion of the dielectric layer is disposed between the carrier and the bottom surfaces of the first conductive wall, the second conductive wall and the first insulation wall.

5. The semiconductor package device of claim 1, further comprising a second insulation wall disposed adjacent to the first conductive wall.

6. The semiconductor package device of claim 5, further comprising a semiconductor wall disposed adjacent to the second insulation wall.

7. The semiconductor package device of claim 1, wherein the bottom surfaces of the first conductive wall, the second conductive wall and the first insulation wall are substantially coplanar.

8. The semiconductor package device of claim 2, wherein the top surfaces of the first conductive wall, the second conductive wall and the first insulation wall are substantially coplanar.

9. The semiconductor package device of claim 1, wherein the insulation wall and the first and second conductive walls have a concave-convex structure.

10. A semiconductor package device, comprising:
a first conductive wall;
a second conductive wall;
an insulation wall disposed between the first and second conductive walls;
a dielectric layer covering a top surface of the first conductive wall, a top surface of the second conductive wall and a top surface of the insulation layer;
a first conductive via penetrating the dielectric layer and in contact with the first conductive wall;
a second conductive via penetrating the dielectric layer and in contact with the second conductive wall;
a first electrode electrically connected to the first conductive wall via the first conductive via; and
a second electrode electrically connected to the second conductive wall via the second conductive via,
wherein the first electrode and the second electrode are at different elevations.

11. The semiconductor package device of claim 10, wherein the first electrode is electrically connected to a set of first conductive walls and the second electrode is electrically connected to a set of second conductive walls.

12. The semiconductor package device of claim 10, wherein the first electrode and the second electrode are electrically connected to an anode and a cathode of an external power source, respectively.

13. The semiconductor package device of claim 10, further comprising a passivation layer disposed on the dielectric layer.

14. The semiconductor package device of claim 13, wherein the first electrode is encapsulated by the passivation layer.

15. The semiconductor package device of claim 10, further comprising a third electrode electrically connected to the first electrode and a fourth electrode electrically connected to the second electrode, wherein the first electrode and the fourth electrode are connected to the anode and the cathode of the external power source, respectively.

16. A semiconductor package device, comprising:
a first conductive wall;
a second conductive wall;
a first insulation wall disposed between the first and second conductive walls;
a dielectric layer having a first portion covering a bottom surface of the first conductive wall, a bottom surface of the second conductive wall and a bottom surface of the first insulation wall;
a first electrode electrically connected to the first conductive wall;
a second electrode electrically connected to the second conductive wall; and
a carrier, wherein the first portion of the dielectric layer is disposed between the carrier and the bottom surfaces of the first conductive wall, the second conductive wall and the first insulation wall, and wherein the carrier is made of oxides.

17. The semiconductor package device of claim 16, wherein the dielectric layer is in direct contact with the carrier.

* * * * *